United States Patent [19]

Anthony

[11] 4,368,106

[45] Jan. 11, 1983

[54] IMPLANTATION OF ELECTRICAL FEED-THROUGH CONDUCTORS

[75] Inventor: Thomas R. Anthony, Schenectady, N.Y.

[73] Assignee: General Electric Company, Schenectady, N.Y.

[21] Appl. No.: 285,656

[22] Filed: Jul. 21, 1981

Related U.S. Application Data

[63] Continuation-in-part of Ser. No. 200,770, Oct. 27, 1980, abandoned.

[51] Int. Cl.³ .............................. C25D 5/02; C25D 7/04
[52] U.S. Cl. ........................................ 204/15; 204/24; 204/273
[58] Field of Search .................. 204/15, 24, 26, 273, 204/277, 52 R

[56] References Cited

U.S. PATENT DOCUMENTS

| | | | |
|---|---|---|---|
| 2,682,501 | 6/1954 | Teal | 204/24 |
| 3,259,049 | 7/1966 | Uithoven | 204/277 |
| 3,301,939 | 1/1967 | Krasnow | 204/15 |
| 3,483,095 | 12/1969 | Bean | 204/15 |
| 3,654,097 | 4/1972 | Degnan | 204/15 |
| 3,798,136 | 3/1974 | Olsen | 204/26 |

*Primary Examiner*—T. Tufariello
*Attorney, Agent, or Firm*—Stephen S. Strunck; James C. Davis, Jr.; Joseph T. Cohen

[57] ABSTRACT

Electrically conductive solid, dense feed-through paths for the high-speed low-loss transfer of electrical signals between integrated circuits of a single silicon-on-sapphire body, or between integrated circuits of several silicon-on-sapphire bodies, are provided by an electroforming method.

22 Claims, 5 Drawing Figures

IMPLANTATION OF ELECTRICAL FEED-THROUGH CONDUCTORS

CROSS-REFERENCE

This application is a continuation-in-part of copending U.S. patent application Ser. No. 200,770, filed Oct. 27, 1980, and now abandoned; the entirety of which is hereby incorporated by reference.

The invention herein is related to the invention disclosed and claimed in U.S. patent application Ser. No. 204,957, filed Nov. 7, 1980 in the name of inventors Anthony, Connery and Hoeschele, Jr., entitled "Method of Forming Conductors Through Silicon-on-Sapphire, and Product", assigned to the same assignee as the instant application, and incorporated herein by reference.

This invention is also related to the invention disclosed and claimed in U.S. patent application Ser. No. 285,668, filed of even date herewith in the name of inventor Anthony and entitled "Periodic Reverse-Current Pulsing to Form Uniformly Sized Feed-Through Conductors", which is assigned to the same assignee as the instant application, and is incorporated herein by reference.

BACKGROUND OF THE INVENTION

1. Field of the Invention

This invention relates to the manufacture of semiconductor devices and more particularly to the formation of solid, dense electrically conductive paths through semiconductor bodies in order to reduce the number and length of conductive interconnections between logic and switching elements on a single body and/or between bodies in a multibody system.

2. Description of the Prior Art

Computer science has developed in an era of computer technology in which wire interconnects were inexpensive and logic and switching elements were expensive. Integrated circuit technology has recently reversed the cost situation leaving wire interconnects as the more expensive component. Interconnections between the integrated circuits of a single chip or wafer, whether made of wires or strips of conducting material, are expensive because they occupy most of the space on the wafer and cause most of the delay in electronic signals passing through the system. The same reasoning holds for interconnections between wafers. Computer architecture theory has just begun to take the cost reversal generated by integrated circuit technology into consideration. As a result, computer design has not yet taken advantage of the full range of capabilities implicit in microelectronics.

Current advances in computer design involve the development of a massively parallel information processing system for ultrahigh speed processing of multiple digital data streams. Such multiple data streams are encountered in situations where interactions of the physical data are significant as, for example, in image processing and studies of weather conditions, economics, hydrodynamics and stresses. The massively parallel array processor with many processors operating simultaneously and in parallel requires many interconnections between processors. With multiple processors, the number of interconnections, the space occupied by interconnections, the delay time caused by interconnections, the power consumed in interconnections, and the cost of interconnections has increased as the square of the number of processors in the system.

The massively parallel array processor system is built utilizing Complementary Metal Oxide Semiconductor/Silicon-on-Sapphire Large Scale Integration (CMOS/SOS LSI) circuitry. Processor arrays on many individual silicon-on-sapphire wafers must also be interconnected. In current technology, all such interconnections must run out to a pad on the edge of a wafer or chip. Such an interconnection scheme has several disadvantages.

First, the number of interconnection pads on the periphery of an LSI circuit is very limited. The relatively small number of interconnection pads severely restricts the information flow to and from an LSI circuit. For example, a typical memory chip has 16,384 bits arranged in a 128 by 128 array. An entire row of 128 bits can be assessed at one time, but a selector enables only a single bit to pass to an output pin. A typical memory system is made of 2,048 such chips arranged in 64 groups of 32. Only 32 chips can place their outputs on the 32 wires that join the bus to the central processor. Of the 262,144 bits that move less than a millimeter on each chip, only 2,048 move 3 millimeters to get off their chip and only 32 move a meter to the processor. In other words, because of an effective traffic tie-up on the interconnections, only about eight-thousandths of the available density of the memory chip can be used at present.

The second disadvantage of the interconnection scheme used by current technology is that a large fraction of the area of an LSI circuit is devoted to interconnections. This waste of a large area of a chip or a wafer is a direct consequence of the restriction of interconnections to substantially two-dimensional configurations. Previous methods of providing conventional conductive paths in three-dimensional configurations by placing the paths in layers on one chip have generally resulted in a decrease in the quality of the processed information due primarily to the phenomenon of cross-talk.

SUMMARY OF THE INVENTION

In accordance with the above-referenced Ser. No. 204,957 invention, a large number of small diameter closely-spaced electrically conductive paths are introduced through silicon-on-sapphire wafers or chips used in information processing equipment. These through-wafer conducting paths substantially reduce the number and length of conductive paths needed on the front face of the wafer; increase the speed and quality of information processing; reduce the power consumed by and the heat generated in interconnections; and provide many more access paths to logic, switching and memory elements on the front face of the wafer. Further, these through-wafer conducting paths provide a means of substantially reducing the physical space occupied by microelectronic circuits by allowing the silicon-on-sapphire wafers to be stacked one on another with the feed-through conductors in each wafer serving as interconnection paths from wafer to wafer.

In accordance with the present invention, there is provided a novel different method of introducing the electrically conductive material into holes extending through the wafer. Briefly described, the method of this invention involves the steps of providing a suitable body of silicon-on-sapphire or a semiconductor material having a plurality of holes therethrough, positioning the body in a suitable electroforming apparatus opposite from an anode, surrounding the body and the anode with an electroforming solution, initiating a flow of bubbles of an inert gas in the space between the anode and the body, establishing a flow of direct current through the electroforming solution between the body and the anode, forming a solid film bridge of metal across the bottom of the holes, growing in the holes a solid, dense implant from the solid film bridge at the bottoms to the tops of the holes, and, optionally, continuing said growth to form implants having rivet-like terminations at each end adjacent to the top and bottom surfaces of the body.

The article of the invention is a body of semiconductor material or silicon-on-sapphire having a plurality of solid, dense metallic implants therethrough. The density of the material of the implants is equal to or greater than about 95%. The implants have the shape of right circular cylinders whose exposed ends are substantially flush or even with the planes of the top and bottom surfaces of the body. The implants may optionally be terminated in rivet-like caps at opposite ends. The rivet-like caps are adjacent to and overlie the major top and bottom surfaces of the body, or any layer of material thereon, serve to lock the implants in place, and additionally may make contact with active devices or connecting lines also situate on the major surfaces.

The diameter of the cylindrical portion of the implant is typically equal to or less than about 4 mils and the center line-to-center line spacing is typically less than or equal to about 2 cylindrical diameters. The lengths of the cylindrical sections are equal to the thickness of the body which typically ranges from about 6 to about 100 mils, thus these cylindrical sections have high-aspect-ratios typically greater than or equal to 6.

The invention also provides a novel electroforming solution which produces copper implants which have a bright, shiny appearance and are soft, solid, and greater than about 95% dense.

BRIEF DESCRIPTION OF THE DRAWINGS

The invention is more clearly understood from the following description taken in conjunction with the accompanying drawings wherein some details have been disproportionately enlarged for clarity and of which.

DETAILED DESCRIPTION OF THE INVENTION

The method of this invention to be described below will produce, for example, feed-throughs useful in the transfer of signals from an integrated circuit on one SOS wafer to one or more integrated circuits on the same SOS wafer and/or to one or more integrated circuits on different SOS wafers. Although this invention will be described with particular reference to silicon-on-sapphire material, the novel technology and objectives of this invention of implanting feed-through conductors is broadly applicable to other materials of the semiconductor arts including, for example, silicon (Si), germanium (Ge), gallium phosphide (GaP), gallium arsenide (GaAs), indium antimonide (InSb), cadmium telluride (CdTe), and zinc sulfide (ZnS).

Figure 1:
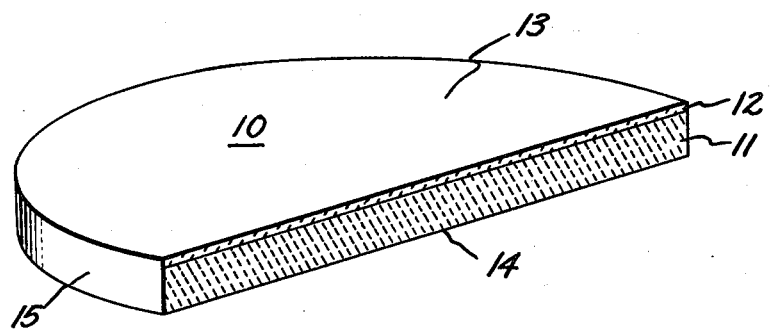
FIG. 1 is a dimensional cross-section of a typical silicon-on-sapphire body.

Referring now to FIG. 1, there is shown a typical silicon-on-sapphire (SOS) body 10. Body 10 is a composite of a substrate of single crystal sapphire 11 and a contiguous overlying epitaxially-grown layer of single crystal silicon 12. Body 10 has front (or top) 13 and back (or bottom) 14 major opposed substantially parallel surfaces and a peripheral edge area 15 interconnecting front 13 and back 14 major surfaces. The two major surfaces are parallel to the (1102) plane of the single crystal sapphire 11 to within $\pm 2°$ and to the (100) plane of the single crystal epitaxial silicon 12 to within $\pm 2°$. The exposed silicon of the front major surface 13 of wafer 10 is typically polished to an optical finish smoother than about $\pm 0.1$ micron and the exposed sapphire of the back major surface 14 of the wafer 10 is typically ground to a finish smoother than about $\pm 0.5$ micron. One or more active integrated circuit semiconductor devices are ordinarily located in the silicon layer 12. The thickness of the epitaxial silicon layer 12 is typically less than about 4 microns while a typical thickness of the sapphire layer 11 is $325 \pm 25$ microns.

Figure 2:
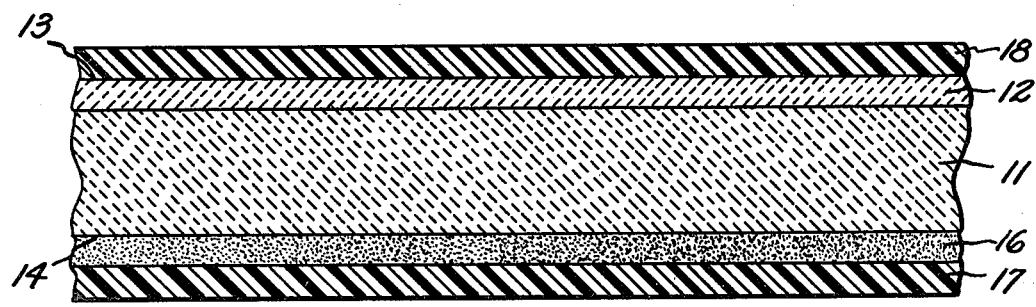
FIG. 2 is an enlarged schematic elevation view in cross-section of a section of the silicon-on-sapphire body of FIG. 1 prepared for laser hole drilling.

In FIG. 2, there is shown a section from the SOS body 10 of FIG. 1 following the application of a conducting thin film metallic layer 16 on back major surface 14 and after the application of thin insulating layers 17 and 18 over the previously deposited thin film metallic layer 16 and the silicon of the top major surface 13, respectively. Insulating layers 17 and 18 may be made using well known photolithographical techniques employing a photoresist or may be made from a low temperature glass or silicon nitride and are provided to protect layer 16 and surface 13, respectively, from damage from debris generated during the laser drilling of holes as described below. Metallic layer 16 is required for the practice of this invention, but layers 17 and 18 are optional. As a practical matter, layers 16, 17, and 18 are so thin that the invention may be discussed with reference to surfaces 13 and 14 or surfaces 13 and 14 and a layer or layers of material thereon interchangeably.

Sputtering, has proven to be the best means for depositing metal layer 16 on sapphire surface 14. Other means such as chemical deposition, metal evaporation and the like do not give a metallic layer 16 with as good adherence to sapphire surface 14 as does sputtering. The thickness of metallic layer 16 is greater than 500 A with a preferred value of 10,000 A. A suitable material for metallic layer 16 is gold. Other suitable metals include copper, nickel, chromium and mixtures and alloys of the same.

Figure 3:
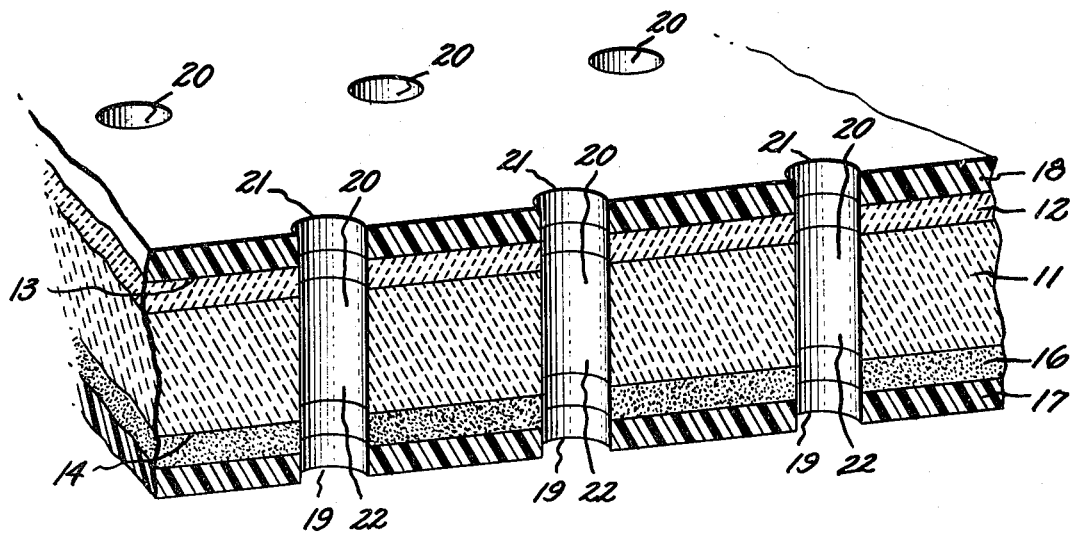
FIG. 3 is a schematic dimensional view in cross-section of the silicon-on-sapphire wafer of FIG. 2 following the laser drilling of holes through the wafer.

Holes 20, as shown in FIG. 3, are drilled in SOS wafer 10 using laser beam techniques. The novel techniques for laser drilling holes through silicon-on-sapphire bodies, to be described below in detail for completeness, are disclosed and claimed in the above-referenced commonly assigned Ser. No. 204,957 application which is filed in the names of the inventive entity thereof, is not the invention of the inventive entity of the instant invention and does not form a part of this invention.

In schematic FIG. 3, the laser beam has impinged on bottom surface 14 and layers 16 and 17 contiguous thereto and drilling has proceeded from bottom surface 14 to top surface 13; thus, entrance apertures 19 are formed in surface 14, contiguous metallic layer 16 and insulating layer 17. Exit apertures 21 are formed in surface 13 and contiguous insulating layer 18. Interior peripheral edge area 22 interconnects entrance aperture 19 and exit apertures 21.

Since the exit aperture of the hole may be smaller than the entrance aperture, it is generally advantageous to drill from back surface 14 since the exit aperture will occupy less area on surface 13 where the active devices are located and the debris generated by drilling will be ejected out the bottom. However, accuracy of location of the aperture on surface 13 will be less than if the drilling proceeds from front surface 13. Therefore, if accurate location of the feedthrough on surface 13 where the integrated circuits are located is the paramount consideration, the drilling is best conducted from front surface 13 to back surface 14.

A laser is the best device for drilling the holes. Mechanical means, such as ultrasonic drilling, cannot produce holes of the fine diameter and close spacing required primarily due to drill breakage from chips in the drill hole as attempts are made to drill holes less than about 8 mils in diameter. The pulse length of other beam devices, such as electron beams, cannot be limited to sufficiently short times to prevent cracking and spalling of the wafer due to thermal stresses. By optical inspection of the birefringent sapphire using crossed polarizers, no strain fields were observed around the laser-drilled holes.

More particularly, a Nd-YAG laser operated in the pulsed Q-switched mode is best suited for the drilling of holes in SOS bodies. Typically, a continuous train of laser pulses at a pulse repetition rate of 3 KHZ and an individual pulse duration of 200 nanoseconds is directed onto and perpendicular to surface 13 or 14. The continuous train of laser pulses is beamed onto surface 13 or 14 for 5 msec and then interrupted for 45 msec and repeated for 5 msec and then interrupted for 45 msec and so forth until the laser beam has drilled a hole 20 completely through body 10.

Approximately 30 pulse trains are required to form holes 20 in a silicon-on-sapphire wafer that is 325 microns thick. The 3 KHZ pulse repetition rate is selected because it gives the highest output power of the laser operating in the repetitively Q-switched mode. Each pulse train is led by a giant pulse which is important because it greatly increases the absorption coefficient of the surface layer of body 10, allowing the following smaller pulses of the pulse train to vaporize and drill out the material comprising body 10. A series of separate pulse trains is used rather than one continuous pulse train in order to obtain more of the desirable giant pulses. The delay time of 45 milliseconds between pulse trains is chosen so that the flash lamps surrounding the Nd-YAG laser crystal have sufficient time to pump up the crystal to an energy density where a giant pulse is produced on initiation of a repetitively Q-switched train of laser beam pulses.

A relationship between laser power level, the number of pulses required to drill holes 20 completely through body 10, and hole geometry and integrity was discovered. Nd-YAG lasers with an energy rating of less than 1 watt in the continuous wave (CW) mode could not drill all the way through SOS wafers 325 microns thick. Use of higher energy lasers is limited in that if fewer than 10 pulse trains are used, cracking and spalling of the wafer 10 will occur. Lower power lasers, about 6 watts in the CW mode, which required more than 100 pulse trains to drill through the 325 micron thick SOS wafers were also found to be satisfactory. When more than 100 pulses were required, the holes were not straight, but exhibited a random walk effect through body 10 such that the exit apertures frequently were not aligned with the entrance apertures, i.e., the axes of the holes were not substantially perpendicular to the major surfaces. Thus the power of the Nd-YAG laser must be such that the holes can be drilled using about 10 to about 100 pulses.

At the low end of the pulse range, holes having the appearance of right circular cylinders with generally circular entrance and exit apertures about 4 mils in diameter can be produced. As the number of pulses increases, the diameter of the entrance aperture decreases, but the holes assume the shape of truncated right circular cones. Use of about 30 pulses was found to be optimum in that truncated cone-shaped holes with entrance diameters on the order of 2 mils and an entrance aperture to exit aperture ratio of about 2 to 1 were produced.

These holes can be spaced in arrays having center line-to-center line, i.e., axis-to-axis, spacings as small as about twice the diameter of the aperture or, in the case of holes having the shape of a truncated cone, about twice the diameter of the larger aperture.

When the Nd-YAG laser was operated in the frequency doubled mode (0.53μ wavelength), at a power level sufficient to produce holes with about 30 pulses, truncated cone-shaped holes having entrance aperture diameters as small as 0.5 mil and exit aperture diameters as small as 0.25 mil were produced. However, as the diameter of the aperture decreases, it becomes more difficult to implant the conducting medium of the feedthrough conductors in the holes when conductor-bearing fluids are employed as described in the above-noted Ser. No. 204,957 application.

It was also found that drilling, particularly from ground back surface 14 of wafer 10, was facilitated by positioning a 0.025" thick polycrystalline wafer of alumina 0.025" away from and parallel to back surface 14 of SOS wafer 10 especially at lower power levels approaching 6 watts in the CW mode. At a separation distance greater than 0.025", drilling yields decreased. At closer separation than 0.025", there was insufficient distance between surface 14 and the polycrystalline alumina backup wafer for debris from laser drilling to clear the region around the intersection between holes 20 and back surface 14 of body 10 with the result that holes 20 became clogged with drilling debris near surface 14.

The SOS body is now ready for implantation of the feed-through conductors in holes 20 in accordance with the novel electroforming method of this invention. By the term electroforming it is meant that a solid plug (implant) of material is grown in holes 20 under the driving force of a direct current (DC) potential. More particularly, by the method of the invention the implant is grown substantially uniformly from one major surface of the body to the opposite major surface. Electroforming is to be distinguished from plating which refers to the application of a thin, i.e., on the order of several mils, film of metal to the surface of a material. Plating may include dipping into molten metal, but it usually refers to the electrodeposition of an adherent coating. In electroplating, metals are deposited from solutions of their salts by means of an electric current. Electroless plating requires no externally applied current and generally proceeds by means of chemical reduction in the presence of a catalytic metal.

Electroforming is also to be distinguished from such other methods as that of U.S. Pat. No. 3,483,095 wherein two solutions are reacted to produce an ionically conductive precipitate insoluable in both solutions and an electric field is applied to extend the precipitate through a pore. A subsequent step, such as exposure to radiation or heat, is required to convert the ionic deposit to a conductor.

Figure 4:
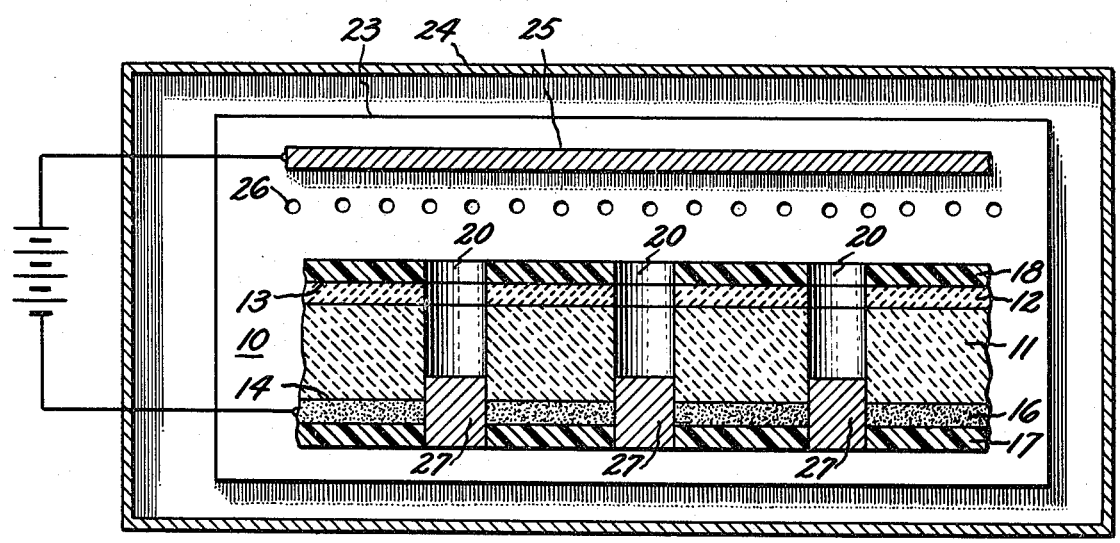
FIG. 4 is a schematic top view in cross-section of the silicon-on-sapphire body of FIG. 3 disposed in the electroforming apparatus.

FIG. 4 shows SOS body 10 in holder 23 in tank 24. Tank 24 is equipped with a cover (not shown) and is capable of sustaining a vacuum. Holder 23, which is made from an inert material, also has means for holding anode 25 parallel to wafer 10 and means, such as the series of holes 26, for flowing an inert gas in the space between wafer 10 and anode 25. The major surface of SOS wafer 10 having thin film conducting layer 16 thereon is placed to face away from anode 25. Anode 25 has approximately the same major surface dimensions and geometry as that of wafer 10 and may be either a solid plate or a screen of the same material, typically copper, to be electroformed in holes 20. Anode 25 is typically spacially removed or separated from wafer 10 by about 1 cm. Gas holes 26 are typically 1.5 mm in diameter and are typically spaced about 4 mm apart.

The positive pole of an external direct current (DC) power source is connected to anode 25 and the negative pole is connected to metal layer 16. Tank 24 is then filled with enough electroforming solution (not shown) to cover anode 25 and body 10. An inert gas is slowly bubbled from holes 26 to the surface of the electroforming solution to provide mixing and agitation of the electroforming solution.

The electroforming solution is substantially an aqueous copper plating solution consisting essentially of from about 220 to about 270 grams/liter of hydrated copper sulfate ($CuSO_4 \cdot 5 H_2O$), from about 5 to about 28 grams/liter sulphuric acid ($H_2SO_4$), from about 0.007 to about 0.013 gram/liter of thiourea ($N_2H_4CS$) and from about 0.3 to about 1.0 gram/liter of molasses. The preferred solution consists essentially of about 250 grams/liter $CuSO_4 \cdot 5 H_2O$, 10 grams/liter $H_2SO_4$, 0.008 gram/liter $N_2H_4CS$ and 0.75 gram/liter molasses. It was discovered that baths of the above composition, of the many different compositions tried, resulted in the most even growth of copper in holes 20. With this solution the copper growth, during the electroforming step to be described, filled 100 percent of the volume of holes 20, had a bright copper appearance, was relatively soft, and was typically greater than about 95% dense. The solutions would not work without molasses and of the several brands of molasses tried, the one marketed under the name "Brer Rabbit Molasses" proved to provide the best results. Molasses contents in excess of about 1.0 gram/liter produced an objectionable sticky residue on the wafers.

In the event that the electroforming solution does not readily wet the material of body 10 and, as a consequence, air bubbles are entrapped in holes 20 the following procedure may be used. First, a vacuum of about 1 Torr or greater is established in tank 24. The electroforming solution is next backfilled into tank 24 through a suitable valved opening (not shown) to cover body 10 and anode 25 while the vacuum is maintained, or reestablished if decreased during the backfilling. The vacuum is maintained until all holes are filled and thereafter tank 24 is returned to atmospheric pressure.

When the external power source is activated, an electrolytic cell is formed resulting in the deposition of copper from anode 25 onto the exposed areas of metal layer 16 adjacent to the bottoms of holes 20. The deposited layer will gradually build up to the point where the bottoms of holes 20 are closed by a solid bridge (not shown) of a film of electroformed metal thereacross. Electroforming is then continued as described herein to cause solid implants 27 to grow from the bridges at the bottoms of holes 20 toward anode 25 eventually emerging at front surface 13 or any layer of material thereon such as layer 18 shown in FIGS. 2–5. At a current density of about 1 milliampere per hole 20, the copper implants filled holes 20 in about 150 minutes.

Figure 5:
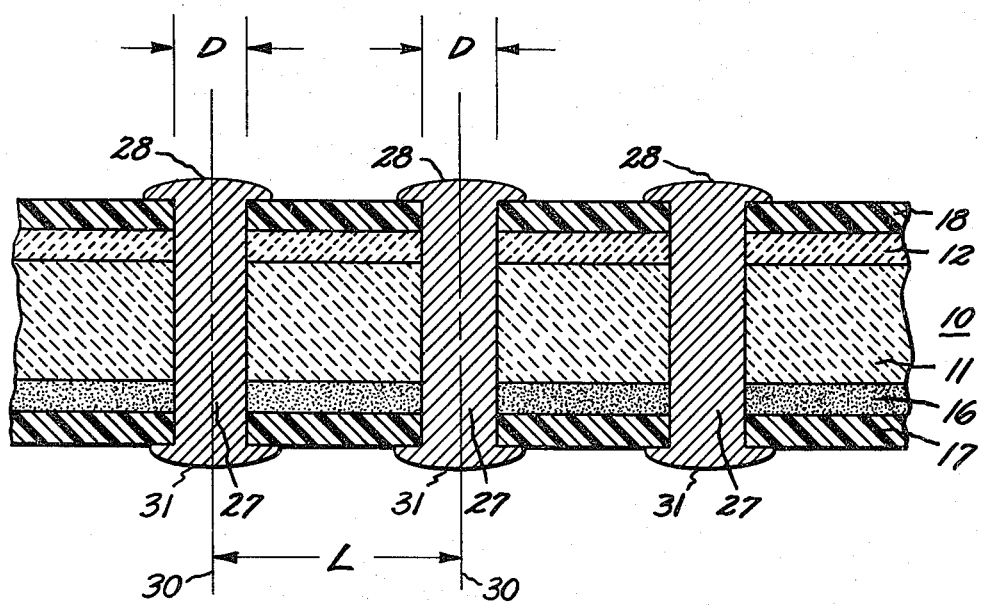
FIG. 5 is a schematic elevation view in cross-section of a section of a silicon-on-sapphire wafer in which the electroformed feed-through conductors have rivet-like terminations.

When the electroformed copper implants reach the tops of holes 20 and the front surface through apertures 21, at the end of the first stage, the process may be terminated or continued, in a second stage, to grow implants 27 both outward toward opposing copper anode 25 as well as along the surface of body 10, or any layers thereon, to form rivet-like terminations 28 as shown in FIG. 5. At the completion of the first stage, implants 27 will be substantially flush with the top and bottom surfaces of body 10 and will be substantially in the form of right circular cylinders. The diameter (D) of the cylinders will be equal to the diameter of holes 20, i.e., will be less than or equal to about 4 mils, and will have center line 30-to-center line 30 spacings (L) equal to or less than about 2D as illustrated in FIG. 5. Cylindrical implants 27 are dense, i.e., greater than or equal to about 95% of theoretical, and have high-aspect-ratios, i.e., ratio of length (thickness of body 10 as measured by the perpendicular distance between surfaces 13 and 14) to diameter, on the order of about at least six-to-one. Density, in the context used here, is a measure of the compactness of a body. The less material per unit volume, and the more volume existing as open spaces within the body, the lower the density. If a body is theoretically dense, i.e., 100% dense, it contains no open spaces such as pores or cavities.

Any irregularities of implants 27 with the top and bottom surfaces may be removed by a subsequent mechanical polishing operation. These first-stage through-thickness implants are useful as heat sinks or may be used for the transfer of electrical signals by placing active devices or conductors in contact with the implants.

By continuing the electroforming process through the second stage, rivet-like heads 28 and 31, shown in FIG. 5, of substantially the same size may be formed adjacent to the top and bottom surfaces or any layers thereon. Rivet-like heads 28 and 31 serve to lock feedthrough conductors 27 in place. Growth along the wafer also facilitates electrical contact with current leads and devices (not shown) on the wafer surface. Growth of rivet-like heads 31 is due to the small leakage current from the back of wafer 10 to anode 25, which is in addition to the major currents directly from the implants 27 to anode 25.

When the growth of copper implants 27 or heads 28 and 31 reach the desired stage, the power source is deactivated, body 10 is removed from the electroforming solution, washed in distilled water, rinsed in methanol and dried.

The method of this invention is ideally suited for wafers 10 containing no more than about 1000 holes 20 of the geometries and spacings described above. As the number of holes increases above about 1000, the growth process becomes unbalanced and certain implants will spontaneously accelerate their growth rates at the expense of others. Those implants experiencing accelerated growth reach the top surface before the more slowly growing implants and continue to grow, usually in an objectionable manner across the top surface of the body, producing rivet heads of undesirable non-uniform size. Where the number of holes to be implanted is in excess of 1000, and upwards of about $10^4$ to $10^6$ holes per wafer for the massively parallel processor, implantation may be readily performed in accordance with the novel method of the above cross-referenced Ser. No. 285,668 application.

Referring now to FIG. 5, solid, dense copper feed-through conductors 27 having rivet-like heads 28 and 31 are shown extending between the major opposed surfaces of body 10. Rivet-like heads 28 and 31 facilitate the stacking of one body 10 upon one or more other bodies 10 thus forming a plurality of separate substantially parallel interwafer paths along implants 27. Thus, electrical signals can be distributed, by use of suitable switching logic (not shown), along one or more intrawafer paths and, simultaneously if required, along one or more interwafer paths.

Conductors 27 require no further treatment, such as curing, which may be the case when conductor-bearing fluids are employed as described in the above-noted Ser. No. 204,957 application. Since no curing is required, there is no possibility of shrinkage occurring and, furthermore, these implants are chemically and thermally stable to the projected limits of operation. The electrical volume resistivity of these copper feed-throughs is typically less than $4 \times 10^{-6}$ ohm-cm. As noted above, implants 27 have densities greater than or equal to about 95% of theoretical and are soft, i.e., have hardness on the order of that of electrolytic copper (commonly referred to as "oxygen-free" copper) which typically measures a maximum of about 65 on the widely-recognized Rockwell $R_F$ scale.

While this invention has been particularly shown and described with reference to preferred embodiments thereof, it will be understood by those skilled in the art that various changes in form and detail may be made therein without departing from the true spirit and scope of the invention as defined by the appended claims.

I claim as my invention:

1. A process for implanting solid, dense, metallic feed-through conductors comprising the steps of:
   (a) providing a body, said body having top and bottom major opposed surfaces substantially parallel to each other, an outer peripheral edge area interconnecting said major surfaces, and a plurality of holes therethrough, one of said major surfaces being overlaid by at least a thin film of a conducting metal, said metal being one selected from the group consisting of gold, copper, nickel, chromium, and mixtures and alloys thereof;
   (b) positioning said body in a tank parallel to an anode such that said thin film on said major surface faces away from said anode and a space is formed between said body and said anode, the metal of said anode being the same as the metal of said solid, dense, metallic feed-through conductors to be implanted;
   (c) surrounding said body and said anode with an electroforming solution, said electroforming solution having therein at least the metal of said solid, dense, metallic feed-through conductors to be implanted;
   (d) initiating a flow of bubbles of an inert gas in said space between said body and said anode;
   (e) establishing a flow of direct current through said solution, between said anode and said thin film;
   (f) forming a solid film bridge of metal across the bottoms of said holes; and
   (g) growing solid, dense, metallic implants in said holes from said solid film bridge at the bottoms of said holes to the tops of said holes.

2. The process of claim 1 wherein said body is composed of a single material, said single material being one selected from the group consisting of silicon, germanium, gallium arsenide, gallium phosphide, indium antimonide, cadmium telluride, and zinc sulfide.

3. The process of claim 1 wherein said body is a composite, said body having a single crystal sapphire substrate and a contiguous overlying epitaxially-grown layer of single crystal silicon, said top major surface being the exposed surface of said silicon layer, said bottom major surface being the exposed surface of said sapphire substrate and said outer peripheral edge area encompassing both said sapphire substrate and said layer of silicon.

4. The process of claim 1 wherein the density of said implants is greater than about 95% of theoretical.

5. The process of claim 1 wherein said tank is capable of sustaining a vacuum.

6. The process of claim 1 wherein said step of establishing a flow of direct current comprises establishing a flow of direct current equal to about one milliampere per hole.

7. The process of claim 5 further including the steps of establishing a vacuum in said tank prior to said surrounding step and, after conducting said surrounding step, maintaining said vacuum in said chamber for a period of time sufficient for said solution to completely fill said plurality of holes and, thereafter, returning said tank to atmospheric pressure.

8. The process of claim 7 wherein said step of establishing a vacuum comprises establishing a vacuum of at least about 1 Torr.

9. The process of claim 1 further including the steps of continuing said flow of direct current until said feed-through conductors have emerged from said holes and simultaneously growing the emerged feed-through conductors away from said top and bottom surfaces and parallel to said top and bottom surfaces forming thereby substantially equally-sized rivet-like terminations on both sides of said body.

10. A process for implanting solid, dense, copper feed-through conductors comprising the steps of:
   (a) providing a body, said body having top and bottom major opposed surfaces substantially parallel to each other, an outer peripheral edge area interconnecting said major surfaces, and a plurality of holes therethrough, one of said major surfaces being overlaid by at least a thin film of a conducting metal, said metal being one selected from the group consisting of gold, copper, nickel, chromium, and mixtures and alloys thereof;
   (b) positioning said body in a tank parallel to an anode such that said thin film on said major surface faces away from said anode and a space is formed between said body and said anode, the metal of said anode being copper;

(c) surrounding said body and said anode with an electroforming solution, said solution being an aqueous solution consisting essentially, in grams per liter, of from about 220 to about 270 grams of hydrated copper sulfate, from about 5 to about 28 grams of sulphuric acid, from about 0.007 to about 0.013 grams of thiourea, and from about 0.03 to about 1.0 gram of molasses;

(d) initiating a flow of bubbles of an inert gas in said space between said body and said anode;

(e) establishing a flow of direct current through said solution, between said anode and said thin film;

(f) forming a solid film bridge of copper across the bottoms of said holes; and (g) growing solid, dense, copper implants in said holes from said solid film bridge at the bottoms of said holes to the tops of said holes.

11. The process of claim 10 wherein said body is composed of a single material, said single material being one selected from the group consisting of silicon, germanium, gallium arsenide, gallium phosphide, indium antimonide, cadmium telluride, and zinc sulfide.

12. The process of claim 10 wherein said body is a composite, said body having a single crystal sapphire substrate and a contiguous overlying epitaxially-grown layer of single crystal silicon, said top major surface being the exposed surface of said silicon layer, said bottom major surface being the exposed surface of said sapphire substrate and said outer peripheral edge area encompassing both said sapphire substrate and said layer of silicon.

13. The process of claim 10 wherein the density of said implants is greater than about 95% of theoretical.

14. The process of claim 10 wherein said tank is capable of sustaining a vacuum.

15. The process of claim 10 wherein the resistivity of each said implant is less than about $4 \times 10^{-6}$ ohm-cm.

16. The process of claim 10 wherein said electroforming solution is an aqueous solution consisting essentially, in grams per liter, of about 250 grams of hydrated copper sulfate, 10 grams of sulphuric acid, 0.008 gram of thiourea, and 0.75 gram of molasses.

17. The process of claim 10 wherein said step of establishing a flow of direct current comprises establishing a flow of direct current equal to about one milliampere per hole.

18. The process of claim 14 further including the steps of establishing a vacuum in said tank prior to said surrounding step and, after conducting said surrounding step, maintaining said vacuum in said tank for a period of time sufficient for said solution to completely fill said plurality of holes and, thereafter, returning said tank to atmospheric pressure.

19. The process of claim 18 wherein said step of establishing a vacuum comprises establishing a vacuum of at least about 1 Torr.

20. The process of claim 10 further including the steps of continuing said flow of direct current until said feed-through conductors have emerged from said holes and simultaneously growing the emerged feed-through conductors away from said top and bottom surfaces and parallel to said top and bottom surfaces forming thereby substantially equally-sized rivet-like terminations on both sides of said body.

21. An electroforming solution, said solution consisting essentially, in grams per liter, of from about 220 grams to about 270 grams hydrated copper sulfate, from about 5 grams to about 28 grams sulfuric acid, from about 0.007 grams to about 0.013 grams thiourea and from about 0.3 to about 1 gram molasses.

22. The electroforming solution of claim 21 wherein the electroforming solution consists essentially, in grams per liter, of about 250 grams of hydrated copper sulfate, about 10 grams of sulphuric acid, about 0.008 gram of thiourea, and about 0.75 gram of molasses.

* * * * *

UNITED STATES PATENT AND TRADEMARK OFFICE
CERTIFICATE OF CORRECTION

PATENT NO. : 4,368,106
DATED : January 11, 1983
INVENTOR(S) : Thomas R. Anthony

It is certified that error appears in the above-identified patent and that said Letters Patent is hereby corrected as shown below:

col. 6, line 6, delete "satisfactory" and insert therefor

-- unsatisfactory -- col. 7, line 42, delete "($CuSO_4 \cdot 5H_2O$)" and insert therefor

-- ($CuSO_4 \cdot 5H_2O$) -- col. 7, line 47, delete "$CuSO_4 \cdot 5H_2O$" and insert therefor

-- $CuSO_4 \cdot 5H_2O$ --

Signed and Sealed this

Twenty-ninth Day of March 1983

[SEAL]

Attest:

GERALD J. MOSSINGHOFF

Attesting Officer     Commissioner of Patents and Trademarks